(12) United States Patent
Saito et al.

(10) Patent No.: US 7,682,541 B2
(45) Date of Patent: Mar. 23, 2010

(54) MANUFACTURING METHOD OF A MICROCHEMICAL CHIP MADE OF A RESIN

(75) Inventors: Mitsuru Saito, Tokyo (JP); Yoshiyuki Ikegami, Tokyo (JP); Kenji Obara, Tokyo (JP)

(73) Assignee: Nippon Filcon Co., Ltd., Tokyo (JP)

( * ) Notice: Subject to any disclaimer, the term of this patent is extended or adjusted under 35 U.S.C. 154(b) by 1380 days.

(21) Appl. No.: 11/103,497

(22) Filed: Apr. 12, 2005

(65) Prior Publication Data
US 2005/0230876 A1 Oct. 20, 2005

(30) Foreign Application Priority Data
Apr. 14, 2004 (JP) .............................. 2004-118667

(51) Int. Cl.
*B29C 39/02* (2006.01)
*B29C 33/40* (2006.01)
(52) U.S. Cl. ........................ 264/219; 264/494; 264/138; 264/238; 264/319
(58) Field of Classification Search ....................... None
See application file for complete search history.

(56) References Cited
U.S. PATENT DOCUMENTS
2004/0121356 A1* 6/2004 Yamagata et al. ............... 435/6

OTHER PUBLICATIONS

"Function Integrated Microchip Using Silicone Rubber," Trigger, Nippon Kogyo Shinbun (Feb. 2002).
Teruo Fujii, "Integrated Microchips for Biochemical Reaction," Nagare, vol. 20, pp. 99-105 (2001).
Web page, "Faculty Member/Institute of Industrial Science/Prof. T. Fujii," Department of Environmental & Ocean Engineering; School of Engineering, University of Tokyo, http://www.naoe.t.u-tokyo.ac.jp/member/faculties/fujii/fujii-e.html (Apr. 2009).

* cited by examiner

*Primary Examiner*—Edmund H. Lee
(74) *Attorney, Agent, or Firm*—Rader, Fishman & Grauer, PLLC

(57) ABSTRACT

A manufacturing method of a microchemical chip made of a resin and having a micro channel, which comprises forming a photoresist film over the surface of one side of a metal support substratum, stacking a photomask for the formation of a channel pattern over the photoresist film, forming a minute-structure photoresist pattern over the metal support substratum by a photofabrication technology as a flat-sheet mold, disposing the flat-sheet mold or unit mold obtained by separating the flat-sheet mold on the bottom of a contour forming frame for resin molding, pouring a resin into the contour forming frame for resin molding and curing the resin to form a resin structure having a micro channel formed by the mold, and attaching the resin structure having a micro channel to a flat sheet to be a lid of the micro channel; and microchemical chips manufactured by this method.

20 Claims, 5 Drawing Sheets

FIG. 1
(a)
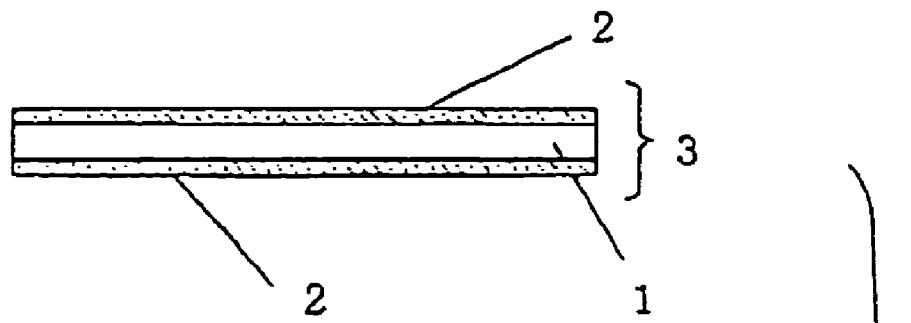
(b)
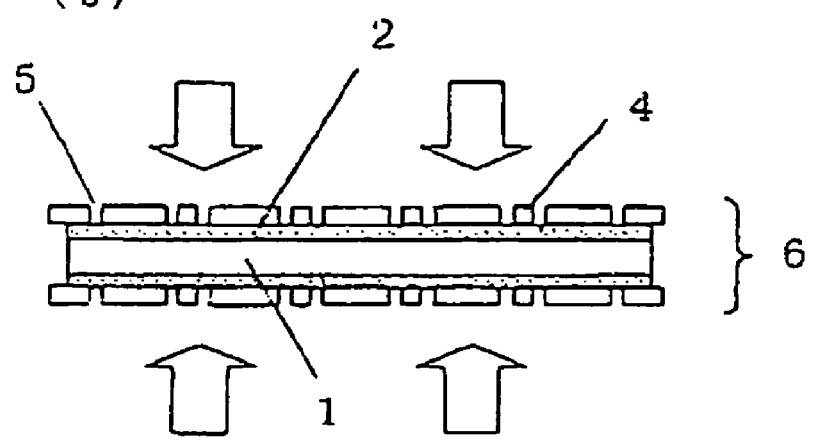
(c)
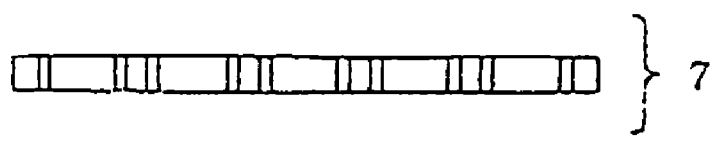

FIG. 3
(e)
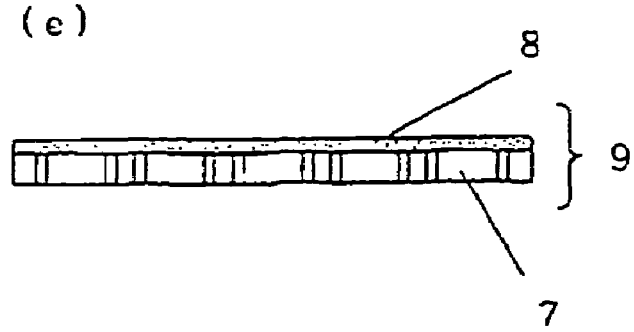
(f)
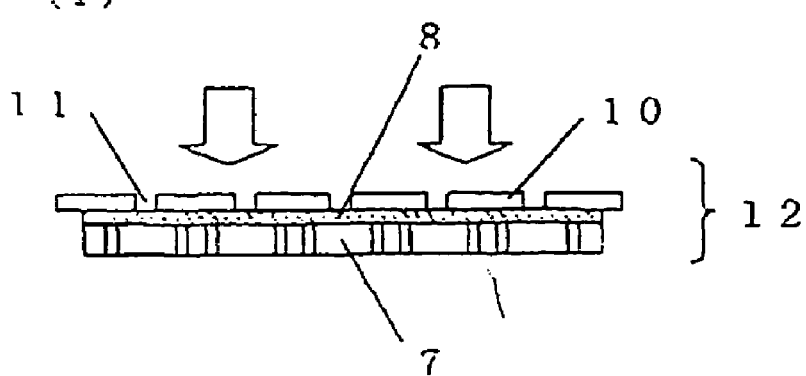
(g)
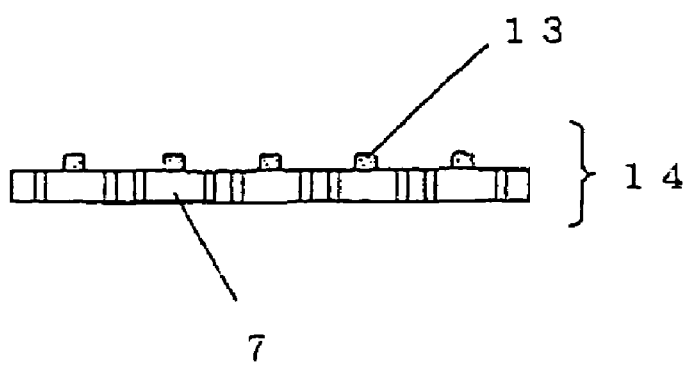

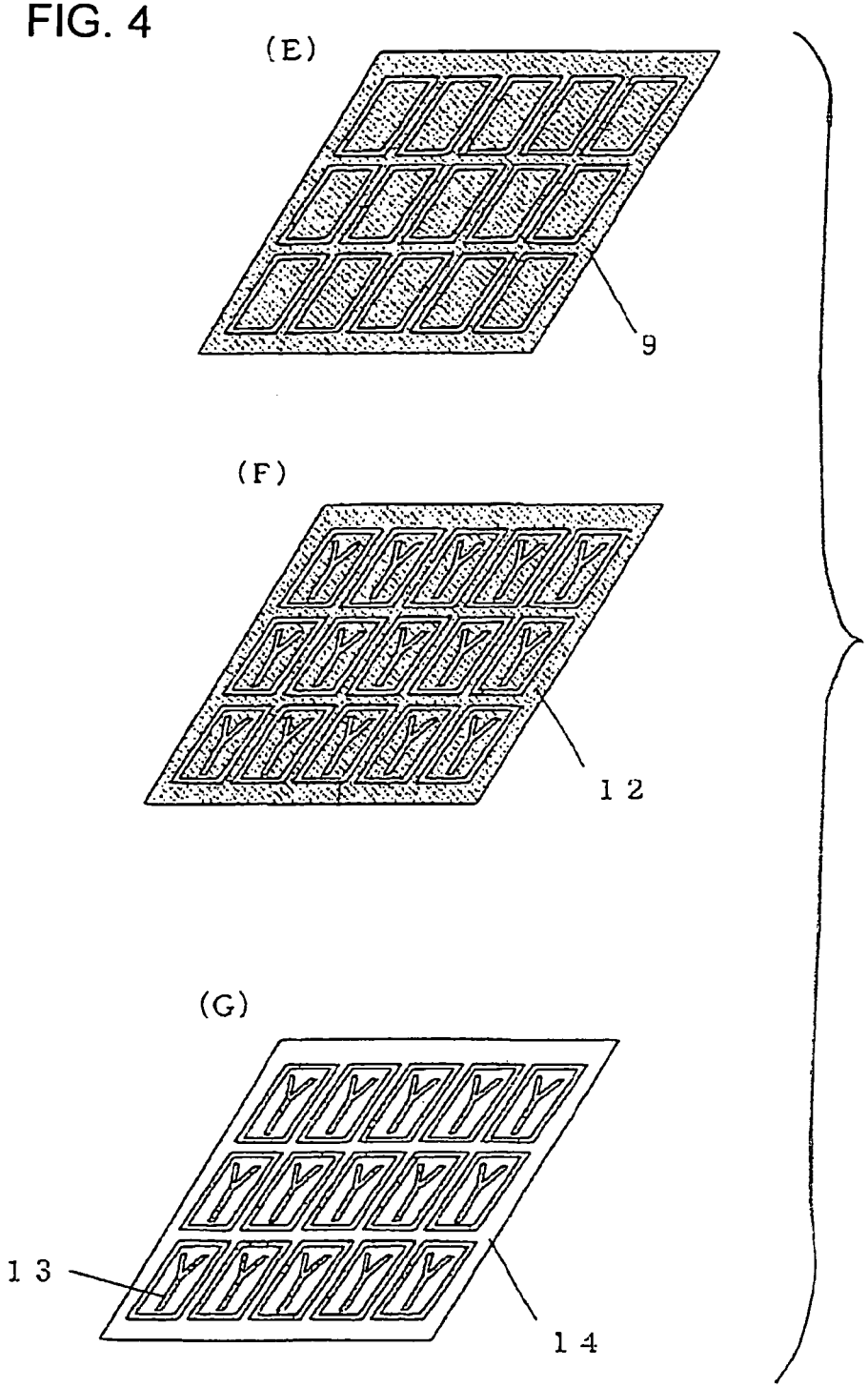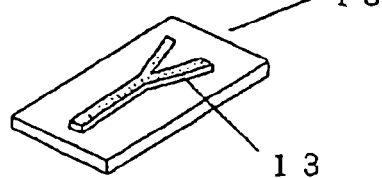

MANUFACTURING METHOD OF A MICROCHEMICAL CHIP MADE OF A RESIN

TECHNICAL FIELD OF THE INVENTION

The present invention relates to a manufacturing method of a microchemical chip made of a resin and a microchemical chip for chemical analysis, chemical reaction, electrophoresis or the like manufactured by the manufacturing method.

DESCRIPTION OF RELATED ART

In recent years, research of μ-TAS (Micro Total Analysis System) using a microchemical chip has been performed in various inspection or analysis fields. Taking advantage of a microchemical chip capable of achieving downsizing of an analysis system, reduction in the analysis time, and reduction in the amount of sample, reagent and waste liquid, studies are proceeding with the practical use of it. For example, a variety of reactions or analyses such as analysis of DNA, cell reaction and cell sorting are carried out using a microchemical chip. These analyses are usually performed in repetition so that a microchemical chip which needs a sample and a reagent in an amount as small as possible and analysis time as short as possible is required. Accordingly, there is a demand for the development of a microchemical chip which is by itself inexpensive and disposable.

A microchemical chip made of a resin is usually composed of a resin structure having a micro channel formed therein and a flat sheet serving as a lid of the micro channel. In most cases, the micro channel of the resin structure is formed by a convex mold obtained by inverting a desired channel geometry. As described in "TRIGGER, March, 92-93(2002)" issued by Nikkan Kogyo Shimbun, as a mold for forming a channel pattern of a microchemical chip made by a PDMS resin, a mold obtained by spin coating a ultra-thick photoresist (SU-8) over a silicon wafer and patterning thisresist by photofabrication technology is used. This photofabrication technology is suited for the formation of such a precise channel.

The silicon support substratum and ultra-thick photoresist used for the above-described mold are very expensive and use of them inevitably heightens the production cost. In addition, a silicon substratum having a relatively large area has not been put on the market so that this material is not suited for the production of many microchemical chip molds at a time. At present, however, the silicon support substratum and ultra-thick photoresist have been used as mold members because of a dimensional tolerance and handling ease.

Another mold forming method is an etching method using a semiconductor process. Described specifically, a mold is formed by forming various thin films over a base material by making use of chemical vapor deposition (CVD), subjecting the films to necessary processing, and dissolving the deposited layers. When glass or quartz is used as a material of the mold, owing to inferior adhesion of it with a photoresist, chromium and gold are deposited successively on the material. A photoresist is then applied to the deposited films, followed by the formation of an inverted shape of the desired mold in the photoresist film by photofabrication technology. The gold film is etched along the resulting photoresist pattern, the chromium film is then etched and finally, the glass is etched. After the processing, the photoresist which becomes unnecessary is removed, followed by removal of the gold layer and chromium layer by reagents suited for the respective layers to leave only the glass. This method needs complicated steps and special equipments, because it requires formation of deposited layers, etching of two deposited layers along the desired minute structure respectively and removal of the deposited layers after completion of the processing of the glass. This also applies to the case where quartz is employed as the base material of a mold.

A microchemical chip is now used in synthetic reaction or electrophoresis analysis in the chemical or medical field, but as described above, a manufacturing method satisfactory in the productivity, cost and precision has not yet been established.

SUMMARY OF THE INVENTION

An object of the present invention is to provide a manufacturing method of a microchemical chip used in synthetic reactions or electrophoresis analyses in the chemical or medical field; and a microchemical chip made of a resin obtained by this method. More specifically, an object of the present invention is to provide a high-variety high-volume manufacturing method of a microchemical chip at a low cost with good productivity without deteriorating microprecision; and a microchemical chip manufactured by this method.

The present invention relates to a manufacturing method of a microchemical chip made of a resin and having a micro channel, which comprises forming a photoresist film over the surface of one side of a metal support substratum, stacking a channel forming photomask over the photoresist film, forming a minute-structure photoresist pattern as a flat-sheet mold over the metal support substratum by photofabrication technology, disposing the flat-sheet mold or a unit mold obtained by dividing the flat-sheet mold on the bottom of a contour forming frame for resin molding, pouring a resin into the contour forming frame for resin molding, curing the resin to form a resin structure having a micro channel formed by the mold, and attaching the resin structure having a micro channel formed therein to a flat sheet serving as a lid of the micro channel.

The flat-sheet mold may have, in the matrix form, a plurality of unit molds for manufacturing respective microchemical chips made of a resin.

The flat-sheet mold may have boundaries from which the plurality of unit molds can be separated from each other.

The photoresist film may be a dry film photoresist.

The resin structure having a micro channel and the flat sheet serving a lid of the micro channel may be made of the same material.

Further, according to the present invention, a microchemical chip made of a resin which comprises a resin structure having a micro channel formed therein and a flat sheet serving as a lid of the micro channel and is manufactured by a method as described in any one of methods described above.

It is possible to mass produce a microchemical chip made of a resin excellent in precision and cost while requiring less steps compared with the conventional method by manufacturing the microchemical chip made of a resin in the following manner: by using a flat-sheet mold obtained by forming, by photofabrication, a resist pattern with a desired microstructure in a resist film formed on the surface of a metal support substratum, disposing the flat-sheet mold or a unit mold obtained by dividing the flat-sheet mold on the bottom of a contour forming frame for resin molding, pouring a resin in the contour forming frame for resin molding, curing the resin to form a resin structure having a micro channel formed therein by using the mold, and bonding the resin structure having a micro channel formed therein to a flat sheet serving as a lid of the structure.

BRIEF DESCRIPTION OF THE DRAWINGS

FIG. 1 is a cross-sectional view illustrating a step of providing a boundary along each unit mold in a metal support substratum base;

FIG. 3 is a cross-sectional view illustrating a manufacturing step of a flat-sheet mold having a plurality of unit molds disposed on a metal support substratum;

FIG. 4 is a perspective view illustrating a manufacturing step of a flat-sheet mold having a plurality of unit molds disposed on a metal support substratum;

FIG. 5 is a perspective view of a unit mold for microchemical chip made of a resin;

DETAILED DESCRIPTION OF THE INVENTION

Figure 2:
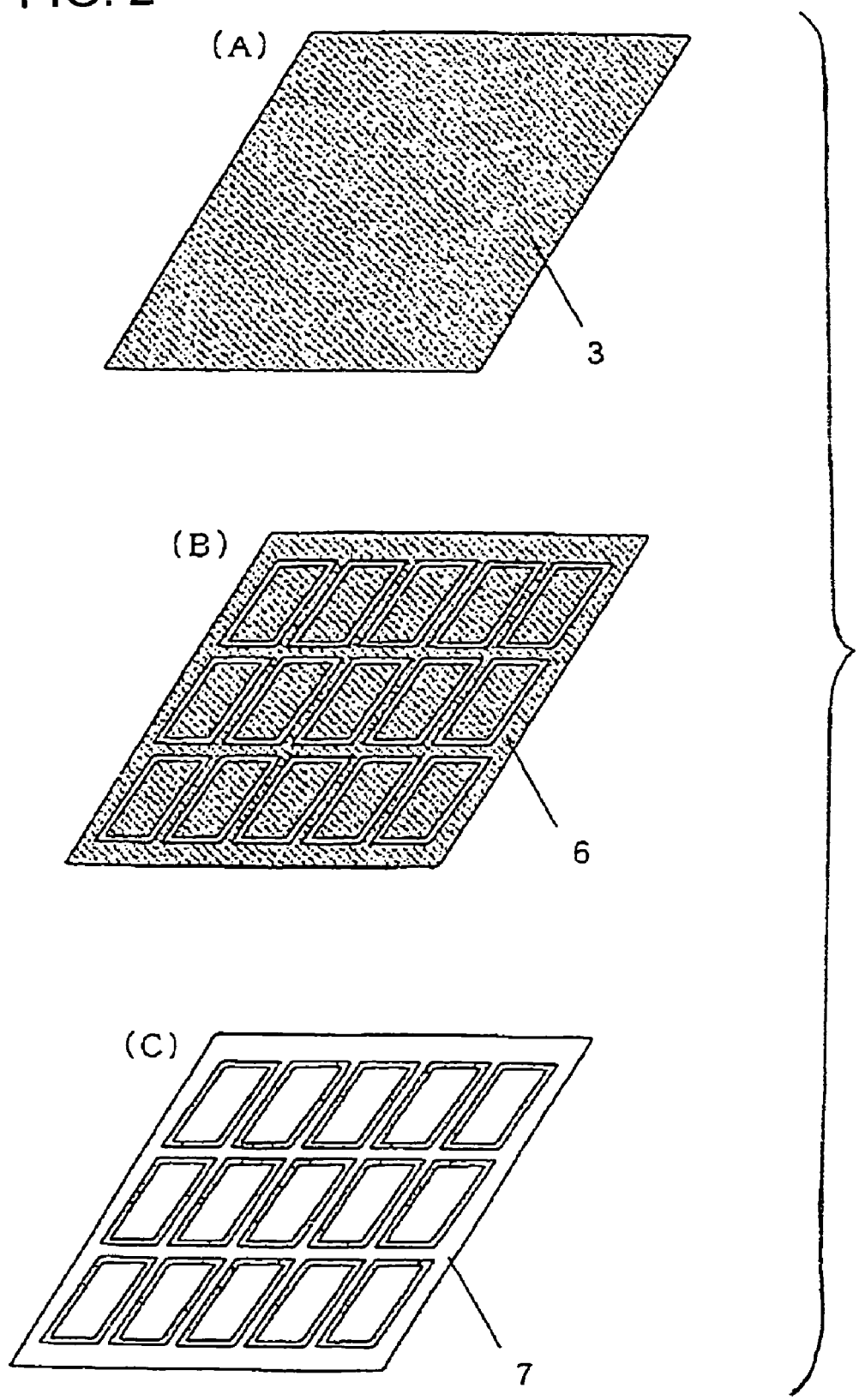
FIG. 2 is a perspective view illustrating a step of providing a boundary along each unit mold in a metal support substratum base.

The present invention relates to a method of manufacturing, with precision and high productivity, a microchemical chip made of a resin and in addition, manufactures it at a low cost by using not special materials. In particular, the present invention is characterized by a manufacturing method of a mold by forming an elaborate and minute pattern in a resin structure.

The mold for forming an elaborate and minute pattern in a resin structure is composed of a metal support substratum and a resist pattern. The metal support substratum serves to support a resist therewith. No particular limitation is imposed on the material or thickness of the metal support substratum, but it has preferably a thickness of from about 0.1 to 0.3 mm in consideration of handling ease. The metal support substratum is preferably made of a material such as copper or stainless.

It is efficient to form a plurality of unit molds from one flat-sheet mold. It is therefore recommended to draw a separable boundary on a metal support substratum base in advance, by which the flat-sheet mold can be separated into unit molds later. The boundary may be formed by etching, half etching or combination thereof with pressing. Any method is usable insofar as the flat-sheet mold can be separated into plural units later. It is preferred to change the thickness or strength of a portion around each unit and to make the flat-sheet mold separable into plural units when a physical force is applied later. In order to facilitate the separation, it is also preferred to arrange a plurality of units in the matrix form and draw a boundary along the contour of each unit. The size of the metal support substratum may be selected as needed in consideration of the productivity, permissible area which an etching apparatus can treat, and handling ease.

A flat-sheet mold having a desired channel pattern in a resist is formed over the metal support substratum. The flat-sheet mold is manufactured in the following manner. First, a resist film is formed on one side of the metal support substratum having a boundary drawn thereon. The resist becomes a mold for forming a channel of the microchemical chip made of a resin. A resist pattern in the form having a width and depth corresponding to those of the channel is left in a portion in which a channel is to be formed, while the other portion of the resist film is removed. The kind or peeling method of the resist may be selected as needed in consideration of a series of steps of the photofabrication technology. A method capable of selectively removing only an unnecessary portion of the resist without damaging the patterned resist film and metal support substratum is employed. The thickness of the resist film will be a depth of the channel so that removal of the resist film must be performed as needed in consideration of it. The following is one example of a manufacturing method of a flat-sheet mold by using a dry film photoresist.

A pattern for forming a micro channel by using a resist is formed in the following manner. First, a resist is applied to the surface of one side of the metal support substratum after degreasing to form a photosensitive polymer film all over the surface. With a photomask prepared in advance, the uniform photosensitive polymer film thus prepared is exposed to form a channel pattern. An exposed portion of a dry film photoresist, which is the photosensitive polymer film, becomes insoluble in a developer owing to the photochemical reaction. By development, washing and drying, a desired resist pattern is then formed over the metal support substratum. A negative resist is used here, but it can of course be replaced by a positive resist.

When a plurality of unit molds are manufactured from one metal support substratum, these units may have either an equal pattern or a different pattern. A mask pattern may be formed according to the request. The channel structure of a microchip is, for example, an ordinarily used one such as "Y-chip" or a more branched structure. The mold of the present invention can be used, in some cases, for the manufacture of a multi-layer diffusion type chip called "MD chip".

According to the present invention, compared with the conventional method, mold formation can be performed by less steps without lowering the pattern precision and at a much lower cost because no expensive materials are used for the manufacture. In short, the invention method can be provided for wide industrial uses because it can satisfy all the requirements for precision, the number of steps and cost.

Although no particular limitation is imposed on the material of the photoresist film, it may be selected as needed, depending on the manufacturing method and the other conditions. From the viewpoint of durability of the film and stability of the material, a dry film photoresist is employed as the photoresist. The dry film photoresist is a negative type photoresist which produces a crosslink reaction when exposed to ultraviolet rays and its resolution is 10 μm at minimum. The dry film photoresist is excellent in heat resistance and has a highly uniform film thickness. Various types having a thickness of from 10 μm to 0.1 mm have been put on the market as the dry film photoresist. It is not necessary to use an expensive thick photoresist which has been used for the conventional flat-sheet mold having a silicon support substratum.

EXAMPLES

A manufacturing method of a microchemical chip made of a resin and having a micro channel according to the present invention will hereinafter be described by Examples.

Figure 6:
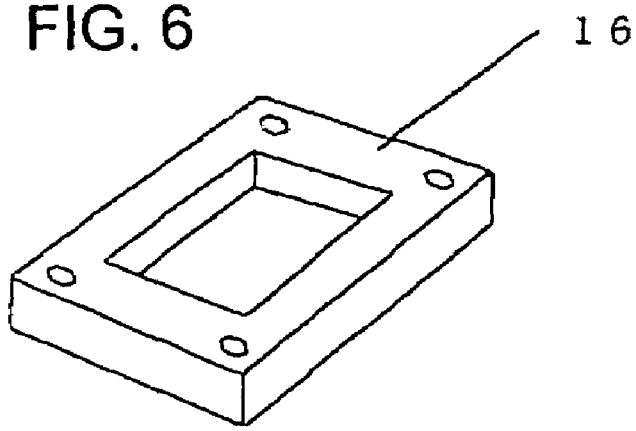
FIG. 6 is a perspective view of a contour forming frame for resin molding.
Figure 7:
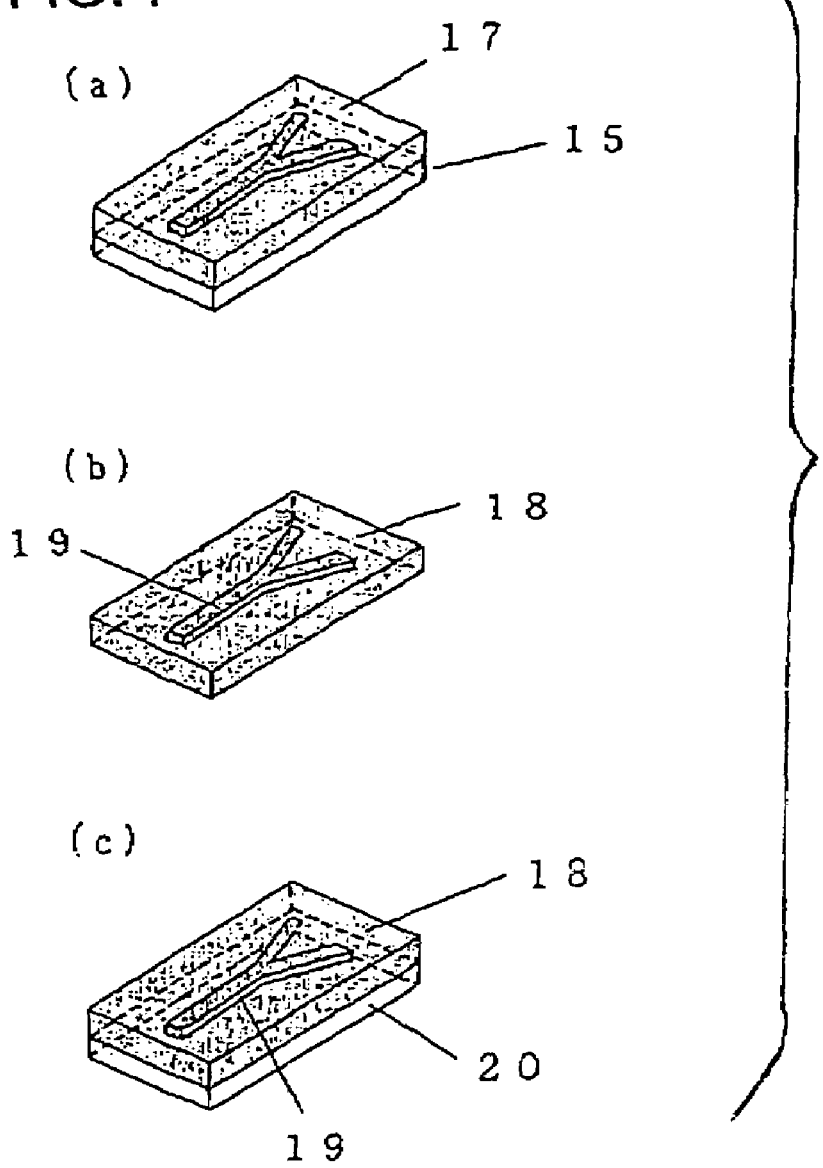
FIG. 7 is a perspective view illustrating a manufacturing step of a microchemical chip made of a resin.

FIGS. 1 to 4 are flow charts illustrating the manufacturing steps of a flat-sheet mold to be used for the manufacture of a microchemical chip made of a resin and having a micro channel according to the present invention. FIG. 1 illustrates a step of providing a boundary along a unit mold in the metal support substratum base; FIG. 2 is a perspective view thereof; FIG. 3 is a cross-sectional view illustrating a step of forming a flat-sheet mold having a plurality of unit molds formed thereon; and FIG. 2 is a perspective view thereof. In FIGS. 1 and 2, (a), (b) and (c) correspond (A), (B) and (C), respectively. In FIGS. 3 and 4, (e), (f) and (g) correspond (E), (F) and (G), respectively. FIG. 5 is a perspective view of each unit mold separated from the flat-sheet mold obtained by the steps of FIGS. 1 and 2. FIG. 6 illustrates a contour forming frame for resin molding to be used for forming the contour of a resin structure constituting a microchemical chip made of a resin. FIG. 7 illustrates a manufacturing step of a microchemical chip made of a resin by using the unit mold.

The manufacturing method of a microchemical chip made of a resin according to the present invention will next be described referring to FIGS. 1 to 4. First, a metal support substratum base 1 is prepared. This metal support substratum base will be a supporting plate of a resist which will be a mold. The thickness the, size or the like of the metal support substratum base may be selected as needed. For example, the size may be selected, depending on the productivity, a permissible area of an etching apparatus or handling ease, while as the thickness, a thickness permitting easy handling may be selected. The material of the base may be selected in consideration of its affinity with a photoresist, and the kind of an etchant to be used. In this Example, a copper sheet having a thickness of 0.2 mm is used. In order to obtain a plurality of unit molds from one metal support substratum, a plurality of contours of the unit molds are drawn on the substratum. Upon formation of mold patterns, the substratum can be treated as one sheet. In order to facilitate separation of the sheet into individual pieces after formation of the pattern, the strength or thickness at the barrier between the units is reduced in advance by etching or the like. It is recommended to form a weak bridge between a part which will be a unit mold and another part which will not be a unit mold so that the unit molds do not separate from each other and can therefore be handled easily upon etching and can be separated easily only by a physical force after etching.

As illustrated in FIG. 1(a), resist films 2 are formed by applying a resist on both sides of the metal support substratum base 1. On both sides of the metal support substratum base 3 having the resist film formed thereon, a mask 4 of a desired pattern is stacked. As the mask pattern, a photomask 4 in which a plurality of patterns defining the contours of respective unit molds are arranged in the matrix form was employed. One unit mold may be formed from one metal support substratum base, but it is recommended to form a plurality of unit molds from one metal support substratum base from the viewpoint of mass productivity. In addition, it is preferred to arrange the unit molds in rows and columns so as to separate them into each unit efficiently. Then, the metal support substratum base 6 having the mask stacked thereover are exposed, on both sides thereof, to ultraviolet rays. By the exposure to ultraviolet rays, the resist at a mask opening portion 5 exposed to ultraviolet rays becomes insoluble in a developer owing to a photochemical reaction and the resist of the other portion dissolves in the developer. After formation of the resist pattern, the metal support substratum base 6 is etched. By such a treatment, the support substratum base 7 is in such a state that unit molds can be separated therefrom easily by applying a physical force to the metal support substratum 7 thus formed, in other words, a bridge for weakly connecting a portion which will be a unit mold and another portion which will not be a unit mold is built. Usually, it is only necessary to define the contour of the unit in advance and then separate the substratum into unit molds by applying a physical force. Alternatively, it is also possible to omit such a step and separate the substratum into unit molds by a cutter or the like after formation of them.

A mold pattern of each unit is formed using a resist on the surface of the metal support substratum 7 after the formation of the contour of the unit. As illustrated in FIG. 3(e), a resist is applied to a surface on one side of the metal support substratum 7, followed by drying to form a resist film 8. With a mask 10 for forming a channel corresponding to a channel pattern, an inverted pattern of a micro channel is formed in the resist film as illustrated in (f). An exposed portion 11 of the resist film becomes insoluble in a developer by the photochemical reaction. The photomask to be used for the formation of a micro channel pattern may be prepared in advance by photofabrication technology. The mask pattern may be composed of same patterns or different patterns and it may be formed according to the using purpose. The resist film is not necessarily an ultra thick resist which was conventionally employed. In this Example, a negative type casein photoresist which is inexpensive is used in consideration of an economical preference. It is needless to say that a positive photoresist can be used instead. The kind or peeling method of the photoresist may be selected as needed in consideration of a series of steps by the photofabrication technology. Any developer is usable insofar as it permits removal of only an unnecessary portion of the resist by peeling without damaging the patterned photoresist film and metal support substratum. The thickness of the resist film becomes a height of the channel so that the thickness must be adjusted as needed. A desired resist pattern is then formed on the metal support substratum by development, washing and drying. Various conditions including the kind of the solution used for development or washing and drying temperature may be selected as needed depending on the material of the resist and supporting substratum.

Thus, the resist film becomes a mold for forming a channel of the microchemical chip made of resin. At a portion in which a channel is formed, a dry film photoresist pattern 13 is left so as to have a width and height corresponding to those of the channel, while from the other portion, the resist film is removed. The micro channel of the microchemical chip usually has a width of from 50 μm to 250 μm and a depth of from 10 μm to 50 μm so that the dry film photoresist pattern may be formed with width and thickness corresponding to them.

In such a manner, as illustrated in (g), a flat-sheet mold 14 having convex resist patterns 13 stacked thereover for the formation of a micro channel was prepared on the surface of the metal support substratum 7. In the next place, a physical force is applied to this flat-sheet mold to separate it into each unit mold. Unit molds can be separated easily only by applying a physical force, because the metal support substratum was formed to have an easy separable structure in the above-described steps of FIGS. 1(a) to 1(c). One of them is illustrated as 15 of FIG. 5. Over the metal support substratum, a channel pattern 13 made of a resist is stacked. This unit mold is placed on the bottom of a contour forming frame for resin molding as 16 of FIG. 6. A resin component material is then poured into this frame, followed by curing, whereby a resin portion, that is, a resin structure of a microchip is formed. Any material can be used for a resin component material insofar as it can be molded or formed. For example, a resin such as PDMS which does not need a special molding machine if there exists an contour forming frame for resin molding may be used, or an acrylic resin which requires a mold as an contour forming frame for resin molding and an injection molding machine may be used. In this Example, an acrylic resin is used, but a component material may be selected as needed, depending on the using purpose of the microchemical chip.

As a contour forming frame for resin molding by which the contour of a resin structure is formed, a mold designed to have a proper size and depth must be used when a resin is injection molded. By using this contour forming frame mold for resin injection molding, resin structures 18 equal in thickness and size can be prepared. In this Example, a mold for forming a rectangular shape is used, but any shape including disc and square can be formed. A resin component material 17 is poured into the contour forming frame 16 for resin molding, followed by curing. From the contour forming frame for resin molding, the resin structure 18 obtained by curing the resin component material 17 and the flat-sheet mold are taken out and then, the flat-sheet mold 15 is removed from the resin structure as illustrated in FIG. 7(*b*), the convex shape of the resist pattern 13 of the mold is transcribed in the resin structure and a concave micro channel 19 is formed therein.

A flat sheet 20 is then attached to the resin structure as a lid for this micro channel. A flat sheet made of a resin prepared in advance by resin molding can be used as the flat sheet 20 serving as a lid of the micro channel. The material of the flat sheet is not limited insofar as it has a flat surface, but a material similar to that used for the resin structure 18 is preferred. Another material, for example, transparent film or glass may be selected, depending on the using purpose. This flat sheet may be equipped with an electrode made of a metal or another necessary apparatus or jig.

A bonding manner of the flat sheet 20 serving as a lid of a micro channel to the resin structure 18 having a micro channel may be selected as needed in consideration of a resin bonding technology suited for each material. For example, when the resin material is PDMS, it may be bonded to a glass plate or the like after subjecting its surface to plasma treatment in an oxygen atmosphere. When the material employed is an acrylic resin, on the other hand, an adhesive or a method of thermocompression molding may be used. Any method can be adopted insofar as it can bond them without damaging the size or shape of the concave part of the micro channel 19 of the resin structure 18. In this example, a thermocompression bonding method is employed.

The microchemical chip according to the present invention can be used widely for combinatorial chemistry which carries out organic synthetic reaction or electrophoresis analysis in a nanoscale microspace and it exhibits excellent effects.

The disclosure of Japanese Patent Application No. 2004-118667 filed Apr. 14, 2004 including specification, drawings and claims is incorporated herein by reference in its entirety.

What is claimed is:

1. A manufacturing method of a microchemical chip made of a resin and having a micro channel, the method comprising:
   etching into a metal support substratum a pattern defining the boundaries of a unit mold,
   forming a photoresist film over the surface of one side of the metal support substratum,
   stacking a channel forming photomask over the photoresist film,
   forming a flat-sheet mold having a minute-structure photoresist pattern over the metal support substratum by photofabrication technology,
   disposing the flat-sheet mold or a unit mold obtained by dividing the flat-sheet mold on the bottom of a contour forming frame for resin molding,
   pouring a resin into the contour forming frame for resin molding,
   curing the resin to form a resin structure having a micro channel formed by the mold, and
   attaching the resin structure having a micro channel formed therein to a flat sheet serving as a lid of the micro channel.

2. The manufacturing method of a microchemical chip made of a resin according to claim 1, further comprising etching into the metal substratum the boundaries of a plurality of unit molds in matrix form for manufacturing respective molds made of a resin.

3. The manufacturing method of a microchemical chip made of a resin according to claim 2, wherein the flat-sheet mold has boundaries from which the plurality of unit molds can be separated from each other.

4. The manufacturing method of a microchemical chip made of a resin according to claim 1, wherein the photoresist film is a dry film photoresist.

5. The manufacturing method of a microchemical chip made of a resin according to claim 2, wherein the photoresist film is a dry film photoresist.

6. The manufacturing method of a microchemical chip made of a resin according to claim 3, wherein the photoresist film is a dry film photoresist.

7. The manufacturing method of a microchemical chip made of a resin according to claim 1, wherein the resin structure having a micro channel formed therein and the flat sheet serving as a lid of the micro channel are made of the same material.

8. The manufacturing method of a microchemical chip made of a resin according to claim 2, wherein the resin structure having a micro channel formed therein and the flat sheet serving as a lid of the micro channel are made of the same material.

9. The manufacturing method of a microchemical chip made of a resin according to claim 3, wherein the resin structure having a micro channel formed therein and the flat sheet serving as a lid of the micro channel are made of the same material.

10. The manufacturing method of a microchemical chip made of a resin according to claim 4, wherein the resin structure having a micro channel formed therein and the flat sheet serving as a lid of the micro channel are made of the same material.

11. The manufacturing method of a microchemical chip made of a resin according to claim 5, wherein the resin structure having a micro channel formed therein and the flat sheet serving as a lid of the micro channel are made of the same material.

12. The manufacturing method of a microchemical chip made of a resin according to claim 6, wherein the resin structure having a micro channel formed therein and the flat sheet serving as a lid of the micro channel are made of the same material.

13. The manufacturing method of a microchemical chip made of a resin according to claim 1,
   wherein etching into the metal support substratum the pattern defining the boundaries of the unit mold is carried out using photofabrication technology.

14. The manufacturing method of a microchemical chip made of resin according to claim 1, wherein said resin is an acrylic resin.

15. The manufacturing method of a microchemical chip made of resin according to claim 1, wherein said resin is polydimethylsiloxane (PDMS).

16. A method for manufacturing a mold for producing a microchemical chip having a micro channel, the method comprising:
   etching into a metal support substratum a pattern defining the boundaries of a unit mold,
   forming a photoresist film over the surface of one side of the metal support substratum, stacking a channel forming photomask over the photoresist film, forming a flat-sheet mold having a minute-structure photoresist pattern over the metal support substratum by photofabrication technology, and disposing the flat-sheet mold or a unit mold obtained by dividing the flat-sheet mold on the bottom of a contour forming frame for resin molding.

17. The method for manufacturing a mold for producing a microchemical chip having a micro channel according to claim 16, further comprising:

etching into the metal substratum the boundaries of a plurality of unit molds in matrix form for manufacturing respective molds made of a resin.

18. The method for manufacturing a mold for producing a microchemical chip having a micro channel according to claim 17, wherein the flat-sheet mold has boundaries from which the plurality of unit molds can be separated from each other.

19. The method for manufacturing a mold for producing a microchemical chip having a micro channel according to claim 16, wherein etching into the metal support substratum the pattern defining the boundaries of the plurality of unit molds arranged in matrix form is carried out using photofabrication technology.

20. The method for manufacturing a mold for producing a microchemical chip having a micro channel according to claim 16, wherein the photoresist film is a dry film photoresist.

* * * * *